(12) United States Patent
Lee et al.

(10) Patent No.: US 9,985,200 B2
(45) Date of Patent: May 29, 2018

(54) MAGNETIC MEMORY DEVICES INCLUDING OXIDIZED NON-MAGNETIC PATTERNS WITH NON-METALLIC ELEMENTS AND METHODS OF FABRICATING THE SAME

(71) Applicants: Joonmyoung Lee, Anyang-si (KR); Whankyun Kim, Seoul (KR); Eunsun Noh, Suwon-si (KR)

(72) Inventors: Joonmyoung Lee, Anyang-si (KR); Whankyun Kim, Seoul (KR); Eunsun Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/603,999

(22) Filed: May 24, 2017

(65) Prior Publication Data

US 2018/0040810 A1 Feb. 8, 2018

(30) Foreign Application Priority Data

Aug. 2, 2016 (KR) ........................ 10-2016-0098625

(51) Int. Cl.
*H01L 43/08* (2006.01)
*H01L 43/02* (2006.01)
*H01L 43/10* (2006.01)
*H01L 43/12* (2006.01)
*G11C 11/16* (2006.01)
*H01L 43/06* (2006.01)
*H01L 43/04* (2006.01)
*H01L 43/14* (2006.01)
(Continued)

(52) U.S. Cl.
CPC .............. *H01L 43/02* (2013.01); *G11C 11/16* (2013.01); *G11C 11/161* (2013.01); *H01L 43/04* (2013.01); *H01L 43/06* (2013.01); *H01L 43/065* (2013.01); *H01L 43/08* (2013.01); *H01L 43/10* (2013.01); *H01L 43/12* (2013.01); *H01L 43/14* (2013.01); *G11B 5/3909* (2013.01); *H01L 27/11502* (2013.01); *H01L 27/11507* (2013.01); *H01L 27/22* (2013.01); *H01L 27/222* (2013.01)

(58) Field of Classification Search
None
See application file for complete search history.

(56) References Cited

U.S. PATENT DOCUMENTS 7,672,093 B2 3/2010 Horng et al.
7,808,027 B2 10/2010 Horng et al.
(Continued)

FOREIGN PATENT DOCUMENTS

KR 20150136183 9/2015
KR 20160004744 1/2016
(Continued)

*Primary Examiner* — Minh-Loan Tran
(74) *Attorney, Agent, or Firm* — Ward and Smith, P.A.

(57) ABSTRACT

A magnetic memory device can include a first electrode and a first magnetic structure that is spaced apart from the first electrode, where the first magnetic structure can include a magnetic pattern therein. An oxidized non-magnetic pattern can be located between the first magnetic structure and the first electrode, where the oxidized non-magnetic pattern can include a non-metallic element having a standard free energy of oxide formation that is less than about that of a standard free energy of oxide formation of Fe.

29 Claims, 12 Drawing Sheets

(51) Int. Cl.
*H01L 27/11507* (2017.01)
*H01L 27/11502* (2017.01)
*H01L 27/22* (2006.01)
*G11B 5/39* (2006.01)

(56) References Cited

U.S. PATENT DOCUMENTS

| | | |
|---|---|---|
| 8,852,760 B2 | 10/2014 | Wang et al. |
| 8,981,505 B2 | 3/2015 | Moriyama et al. |
| 2013/0230741 A1* | 9/2013 | Wang ................. G11B 5/82 |
| | | 428/826 |
| 2015/0228891 A1 | 8/2015 | Park et al. |
| 2016/0005953 A1 | 1/2016 | Lee |
| 2016/0043300 A1 | 2/2016 | Kim et al. |
| 2016/0079520 A1* | 3/2016 | Park ................. H01L 29/82 |
| | | 257/421 |
| 2017/0092848 A1 | 3/2017 | Jang et al. |

FOREIGN PATENT DOCUMENTS

| | | |
|---|---|---|
| KR | 20160019263 | 2/2016 |
| KR | 1020160019253 | 2/2016 |
| KR | 1020170037707 | 4/2017 |

* cited by examiner

MAGNETIC MEMORY DEVICES INCLUDING OXIDIZED NON-MAGNETIC PATTERNS WITH NON-METALLIC ELEMENTS AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2016-0098625, filed on Aug. 2, 2016, in the Korean Intellectual Property Office, the entire content of the which is hereby incorporated herein by reference.

BACKGROUND

The present disclosure relates to a magnetic memory device and a method of fabricating the same, and in particular, to a magnetic memory device with a magnetic tunnel junction and a method of fabricating the same.

A magnetic memory device can include a magnetic tunnel junction (MTJ) pattern. A magnetic tunnel junction pattern may include two magnetic layers and a tunnel barrier layer interposed therebetween. Resistance of the magnetic tunnel junction pattern may vary depending on magnetization directions of the magnetic layers. For example, the resistance of the magnetic tunnel junction pattern may be greater when magnetization directions of the magnetic layers are anti-parallel to each other compared to when they are parallel to each other. Such a difference in resistance can be used for data storing operations of the magnetic memory device.

SUMMARY

Embodiments according to the invention can provide magnetic memory devices and methods of fabricating the same. In some embodiments according to the inventive concept, a magnetic memory device can include a first electrode and a first magnetic structure that is spaced apart from the first electrode, where the first magnetic structure can include a magnetic pattern therein. An oxidized non-magnetic pattern can be located between the first magnetic structure and the first electrode, where the oxidized non-magnetic pattern can include a non-metallic element having a standard free energy of oxide formation that is less than about that of a standard free energy of oxide formation of Fe.

In some embodiments according to the inventive concept, A magnetic memory device can include a first electrode and a first magnetic structure that is spaced apart from the first electrode, where the first magnetic structure can include a magnetic pattern therein. An oxidized non-magnetic pattern can be between the first magnetic structure and the first electrode, where the oxidized non-magnetic pattern can include B.

In some embodiments according to the inventive concept, a magnetic memory device can include a first electrode and a first magnetic structure, where the first magnetic structure can include a magnetic pattern including CoFeB. A non-magnetic pattern can be between the first magnetic structure and the first electrode, where the non-magnetic pattern can include TaBOx. A second magnetic structure can be spaced apart from the first magnetic structure and a tunnel barrier pattern can be between the first magnetic structure and the second magnetic structure.

In some embodiments according to the inventive concept, a magnetic memory device can include a first electrode and a first magnetic structure, where the first magnetic structure can include a graded magnetic pattern that includes CoFeB. A non-magnetic pattern can be between the first magnetic structure and the first electrode, where the non-magnetic pattern can include TaBOx. A second magnetic structure can be spaced apart from the first magnetic structure and a tunnel barrier pattern can be between the first magnetic structure and the second magnetic structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
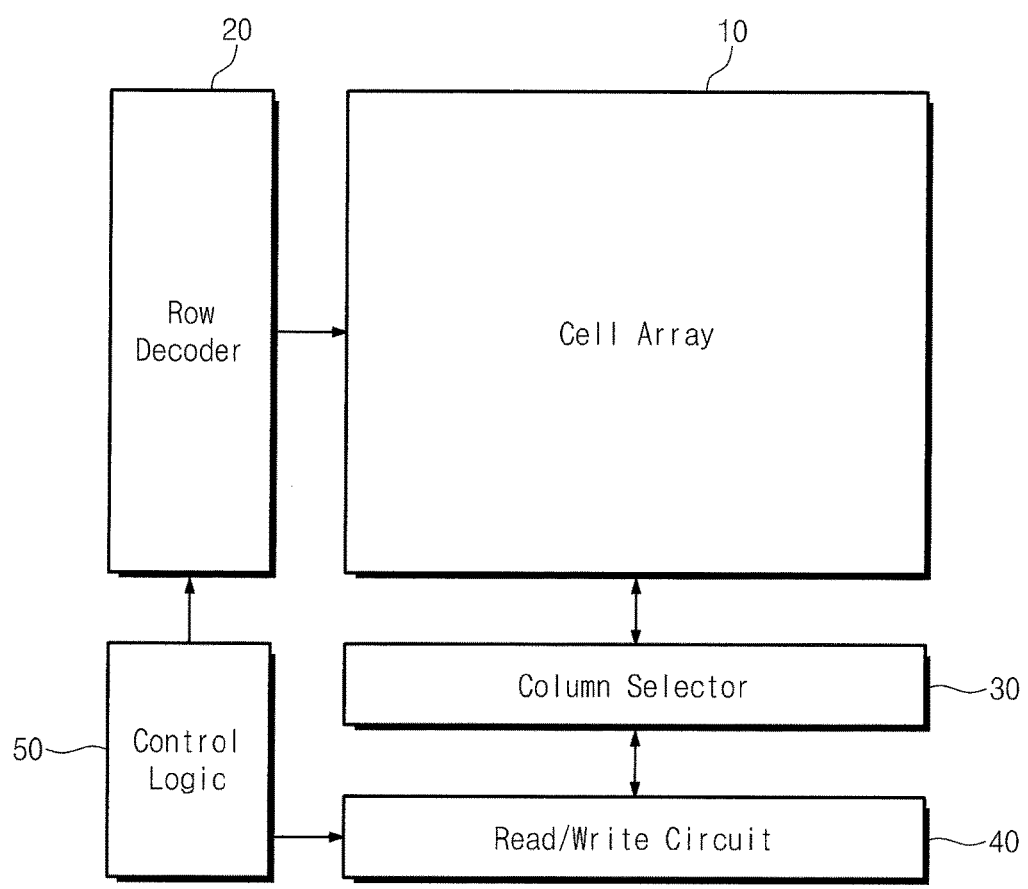
FIG. 1 is a block diagram of a magnetic memory device according to some embodiments of the inventive concept.

FIG. 1 is a block diagram of a magnetic memory device according to some embodiments of the inventive concept.

Referring to FIG. 1, a magnetic memory device may include a memory cell array 10, a row decoder 20, a column selection circuit (or column selector) 30, a read and write circuit 40, and a control logic 50.

The memory cell array 10 may include a plurality of word lines, a plurality of bit lines, and a plurality of memory cells provided at intersections between the word and bit lines. The structure of the memory cell array 10 will be described in more detail with reference to FIG. 2.

The row decoder 20 may be connected to the memory cell array 10 through the word lines. The row decoder 20 may be configured to decode address information input from the outside and thereby to select one of the word lines.

The column selection circuit 30 may be connected to the memory cell array 10 through the bit lines and may be configured to decode address information input from the outside and thereby to select one of the bit lines. The bit line selected by the column selection circuit 30 may be connected to the read and write circuit 40.

The read and write circuit 40 may provide a bit line bias for accessing to the selected memory cell, in response to control signals from the control logic 50. Furthermore, the read and write circuit 40 may provide the bit line voltage to the selected bit line to write or read data to or from the memory cell.

The control logic 50 may output control signals for controlling the semiconductor memory device, in response to command signals input from the outside. The control signals output from the control logic 50 may be used to control the read and write circuit 40.

Figure 2:
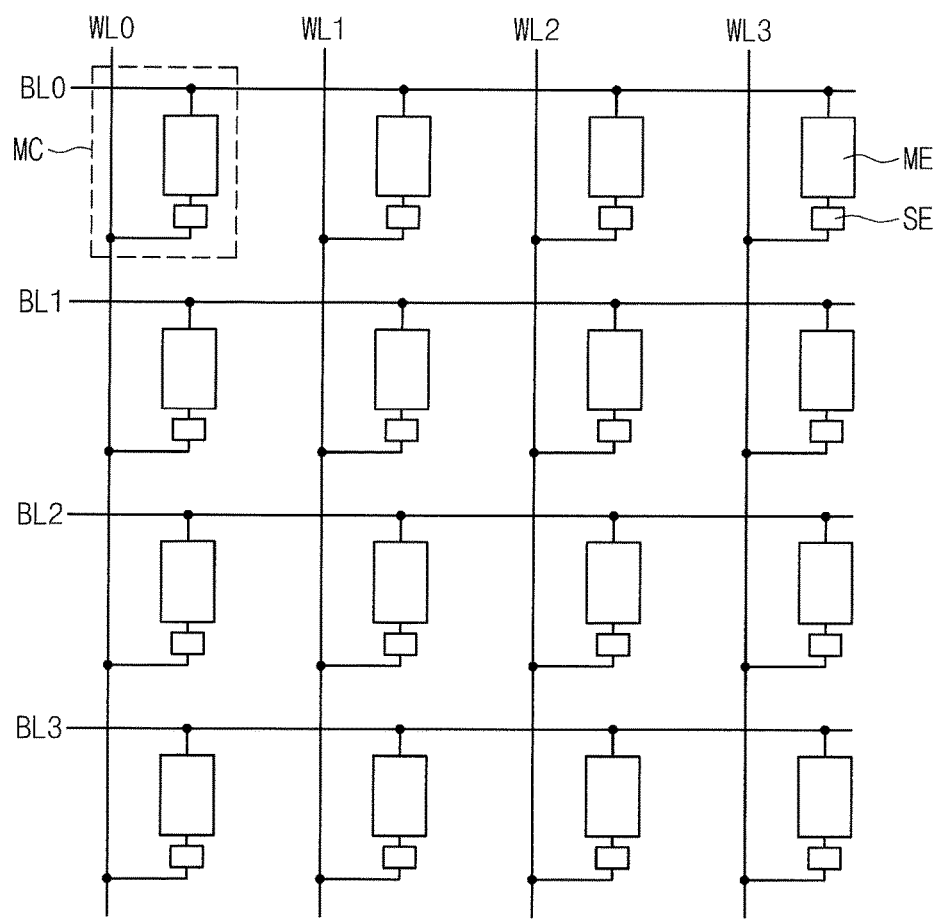
FIG. 2 is a circuit diagram illustrating a memory cell array of a magnetic memory device according to some embodiments of the inventive concept.
Figure 3:
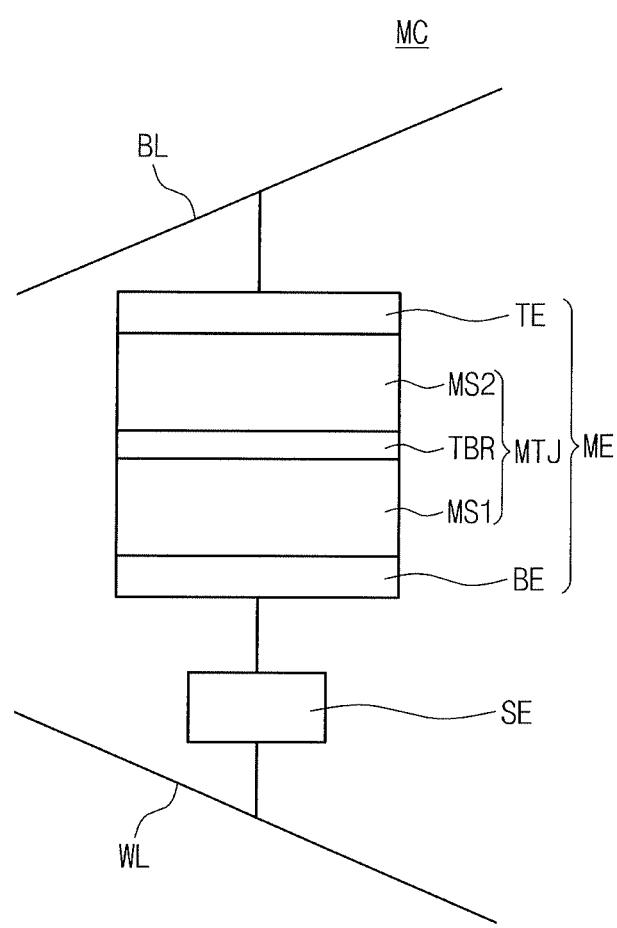
FIG. 3 is a circuit diagram illustrating a unit memory cell of a magnetic memory device according to some embodiments of the inventive concept.

FIG. 2 is a circuit diagram illustrating a memory cell array of a magnetic memory device according to some embodiments of the inventive concept, and FIG. 3 is a circuit diagram illustrating a unit memory cell of a magnetic memory device according to some embodiments of the inventive concept.

Referring to FIG. 2, the memory cell array 10 may include a plurality of first conductive lines, a plurality of second conductive lines, and a plurality of unit memory cells MC. In some embodiments, the first conductive lines may serve as word lines WL0-WL3, and the second conductive lines may serve as bit lines BL0-BL3. The unit memory cells MC may be two- or three-dimensionally arranged. The word lines WL and the bit lines BL may be provided to cross each other, and each of the unit memory cells MC may be provided at a corresponding one of intersections between the word lines WL and the bit lines BL. Each of the word lines WL may be connected to a plurality of the unit memory cells MC. The unit memory cells MC connected to each of the word lines WL may be connected to the bit lines BL, respectively, and the unit memory cells MC connected to each of the bit lines BL may be connected to the word lines WL, respectively. Accordingly, the unit memory cells MC connected to the word line WL may be connected to the read and write circuit 40, described with reference to FIG. 1, through the bit lines BL.

Referring to FIG. 3, each of the unit memory cells MC may include a memory element ME and a selection element SE. The memory element ME may be provided between the bit line BL and the selection element SE, and the selection element SE may be provided between the memory element ME and the word line WL. The memory element ME may be a variable resistance device whose resistance can be switched to one of at least two states by an electric pulse applied thereto.

In some embodiments, the memory element ME may have a layered structure, whose electric resistance can by changed by a spin transfer process using an electric current passing therethrough. For example, the memory element ME may have a layered structure configured to exhibit a magneto-resistance property and may include at least one ferromagnetic material and/or at least one antiferromagnetic material.

The selection element SE may be configured to selectively control a current flow of an electric current passing through the memory element ME. For example, the selection element SE may be one of a diode, a pnp bipolar transistor, an npn bipolar transistor, an n-channel metal-oxide-semiconductor field effect transistor (NMOS-FET), and a PMOS-FET. In the case that the selection element SE is a three-terminal switching device (e.g., a bipolar transistor or a MOSFET), an additional interconnection line may be connected to a control electrode or gate of the selection element SE.

In detail, the memory element ME may include a first magnetic structure MS1, a second magnetic structure MS2, and a tunnel barrier TBR therebetween. The first magnetic structure MS1, the second magnetic structure MS2, and the tunnel barrier TBR may constitute a magnetic tunnel junction MTJ. Each of the first and second magnetic structures MS1 and MS2 may include at least one magnetic layer made of a magnetic material. The memory element ME may include a bottom electrode BE interposed between the second magnetic structure MS2 and the selection element SE and a top electrode TE interposed between the first magnetic structure MS1 and the bit line BL.

Figure 4:
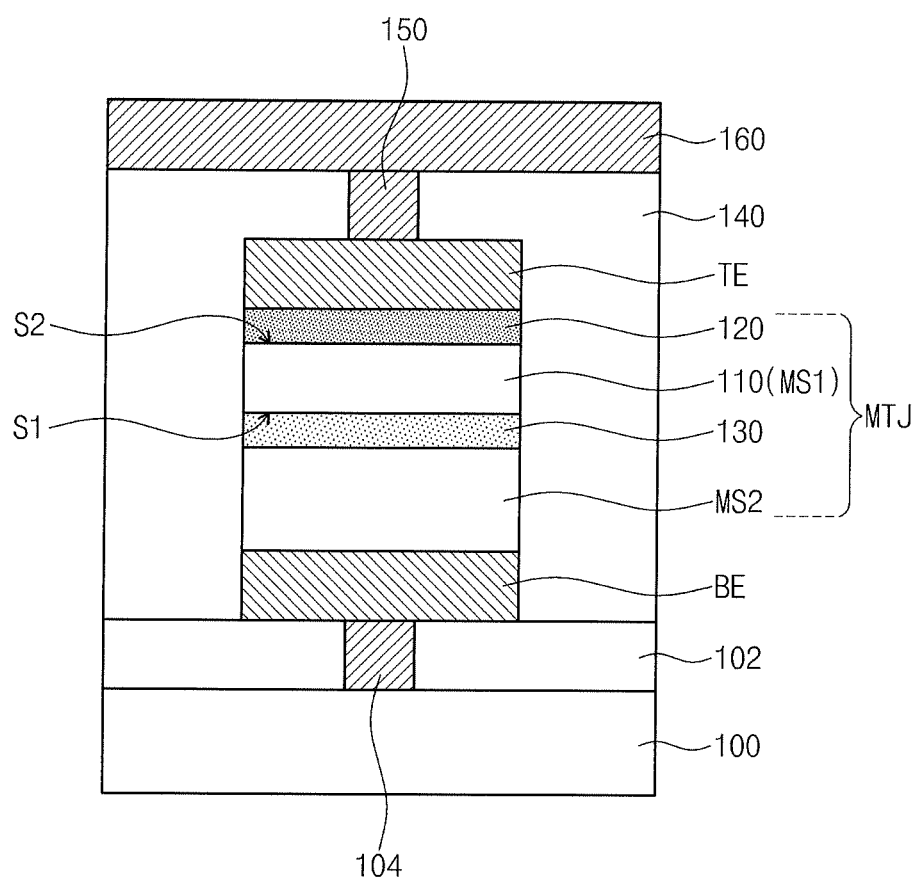
FIG. 4 is a sectional view illustrating a magnetic memory device according to some embodiments of the inventive concept.

FIG. 4 is a sectional view illustrating a magnetic memory device according to some embodiments of the inventive concept.

Referring to FIG. 4, a lower interlayered insulating layer 102 may be provided on a substrate 100. The substrate 100 may be a semiconductor substrate (e.g., including silicon, silicon-on-insulator (SOI), silicon germanium (SiGe), germanium (Ge), gallium arsenide (GaAs)). Selection elements may be provided on the substrate 100, and the lower interlayered insulating layer 102 may be provided to cover the selection elements. The selection elements may be field effect transistors or diodes. The lower interlayered insulating layer 102 may be formed of or include oxide, nitride, and/or oxynitride.

A lower contact plug 104 may be provided in the lower interlayered insulating layer 102. The lower contact plug 104 may be provided to penetrate the lower interlayered insulating layer 102 and may be electrically coupled to a terminal of a corresponding one of the selection elements. The lower contact plug 104 may include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide). In some embodiments, the lower contact plug 104 may have a top surface that is substantially coplanar with that of the lower interlayered insulating layer 102.

A bottom electrode BE, a magnetic tunnel junction pattern MTJ, and a top electrode TE may be sequentially stacked on the lower interlayered insulating layer 102. The bottom electrode BE may be electrically coupled to a top surface of the lower contact plug 104. The bottom electrode BE, the magnetic tunnel junction pattern MTJ, and the top electrode TE may be provided to have vertically-aligned outer sidewalls. The bottom electrode BE may include a conductive material. As an example, the bottom electrode BE may include at least one of conductive metal nitrides (e.g., titanium nitride and tantalum nitride). The top electrode TE may also include a conductive material. For example, the top electrode TE may include at least one of metals (e.g., tantalum (Ta), aluminum (Al), copper (Cu), gold (Au), silver (Ag), and titanium (Ti)) or conductive metal nitrides (e.g., tantalum nitride (TaN) and titanium nitride (TiN)).

The magnetic tunnel junction pattern MTJ may include a first magnetic structure MS1, a second magnetic structure MS2, and a tunnel barrier pattern 130 therebetween. The first magnetic structure MS1 may be provided between the top electrode TE and the tunnel barrier pattern 130, and the second magnetic structure MS2 may be provided between the bottom electrode BE and the tunnel barrier pattern 130. The magnetic tunnel junction pattern MTJ may include a non-magnetic pattern 120 that is spaced apart from the tunnel barrier pattern 130 with the first magnetic structure MS1 interposed therebetween. The non-magnetic pattern 120 may be interposed between the first magnetic structure MS1 and the top electrode TE. The first magnetic structure MS1 may include a magnetic pattern 110. The magnetic pattern 110 may be provided between the tunnel barrier pattern 130 and the non-magnetic pattern 120, and the non-magnetic pattern 120 may be provided between the magnetic pattern 110 and the top electrode TE.

The magnetic pattern 110 may include a magnetic material exhibiting an intrinsic in-plane magnetization property. In the present specification, the term "intrinsic in-plane magnetization property" means that a magnetization direction of a magnetic layer is oriented parallel to a longitudinal direction thereof, when there is no external magnetic field applied thereto. For example, in the case where a magnetic layer with the intrinsic in-plane magnetization property is formed on a substrate, a magnetization direction of the ferromagnetic layer may be substantially parallel to a top surface of the substrate. In other words, the magnetic pattern 110 may have a magnetization direction that is parallel to a largest surface thereof, when there is no external magnetic field applied thereto. The intrinsic in-plane magnetization property may be realized by using a single- or multi-layered structure, in which at least one of cobalt (Co), iron (Fe), and alloys thereof is contained. In some embodiments, the magnetic pattern 110 may include cobalt (Co), iron (Fe), and a first non-metallic element. The first non-metallic element may be, for example, boron (B). For example, the magnetic pattern 110 may be a single layered structure of CoFeB.

The non-magnetic pattern 120 may be an oxide layer. The non-magnetic pattern 120 may be formed of or include metal oxide. The non-magnetic pattern 120 may include a non-magnetic metallic element, oxygen, and a second non-metallic element that can be bonded with the oxygen. The second non-metallic element may be different from oxygen. In other words, the second non-metallic element may not be oxygen. The non-magnetic metallic element may be at least one of, for example, Ta, Ti, Mg, Hf, Zr, W, or Mo. The second non-metallic element may be the same as the first non-metallic element. The second non-metallic element may be, for example, boron (B). For example, the non-magnetic pattern 120 may include a boron-containing metal oxide (e.g., boron-containing tantalum oxide (TaBOx)). In the case where the magnetic pattern 110 and the non-magnetic pattern 120 include boron, a boron concentration in the magnetic pattern 110 may be lower than that in the non-magnetic pattern 120. Here, the boron concentration in the magnetic pattern 110 may be defined as a ratio (in percentage) of the number of boron atoms to the total number of atoms in the magnetic pattern 110, whereas the boron concentration in the non-magnetic pattern 120 may be defined as a ratio (in percentage) of the number of boron atoms to the total number of atoms, except for oxygen, in the non-magnetic pattern 120. The boron concentration in the non-magnetic pattern 120 may range from about 2 at % to about 50 at %. In some embodiments, at least a portion of the non-magnetic pattern 120 may be amorphous.

The magnetic pattern 110 may include a first surface S1 in contact with the tunnel barrier pattern 130 and a second surface S2 opposite to the first surface S1. The non-magnetic pattern 120 may be in contact with the second surface S2 of the magnetic pattern 110.

The tunnel barrier pattern 130 may include at least one of magnesium oxide, titanium oxide, aluminum oxide, magnesium-zinc oxide, magnesium-boron oxide, titanium nitride, or vanadium nitride. As an example, the tunnel barrier pattern 130 may be a magnesium oxide (MgO) layer. Alternatively, the tunnel barrier pattern 130 may include a plurality of layers, each of which may be formed of or include at least one of magnesium oxide, titanium oxide, aluminum oxide, magnesium-zinc oxide, magnesium-boron oxide, titanium nitride, or vanadium nitride. An oxygen concentration in the non-magnetic pattern 120 may be lower than that in the tunnel barrier pattern 130. Here, the oxygen concentration in the non-magnetic pattern 120 may be defined as a ratio (in percentage) of the number of oxygen atoms to the total number of atoms in the non-magnetic pattern 120, and the oxygen concentration in the tunnel barrier pattern 130 may be defined as a ratio (in percentage) of the number of oxygen atoms to the total number of atoms in the tunnel barrier pattern 130. Accordingly, in some embodiments, the non-magnetic pattern 120 can be referred to as an oxidized non-magnetic pattern.

The second magnetic structure MS2 may include a ferromagnetic material. The second magnetic structure MS2 may include a plurality of layers, at least some of which are formed of or include a ferromagnetic material.

Accordingly, the oxidized non-magnetic pattern can include a non-metallic element having a standard free energy of oxide formation that is less than about that of a standard free energy of oxide formation of Fe, such as Boron. For example, the non-metallic element can be configured to remain bonded to oxygen after an anneal of the device that includes the oxidized non-magnetic pattern.

Figure 5A:
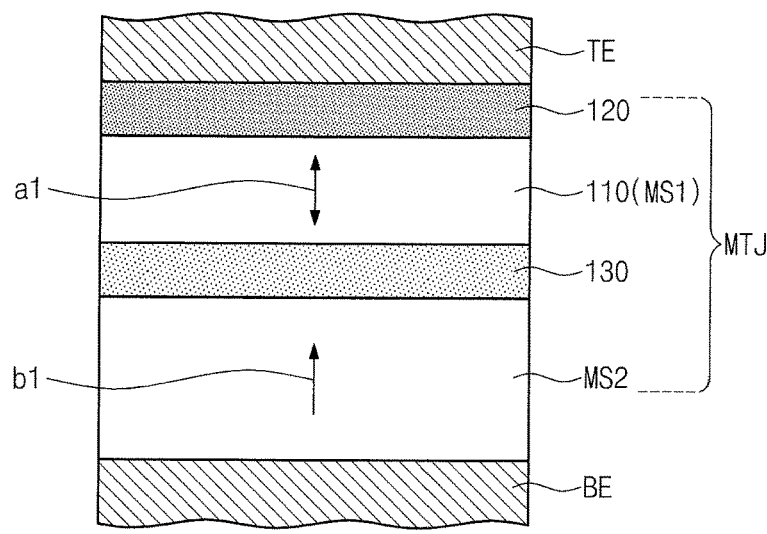
FIG. 5A is a sectional view illustrating an example of the magnetic tunnel junction of FIG. 4.
Figure 5B:
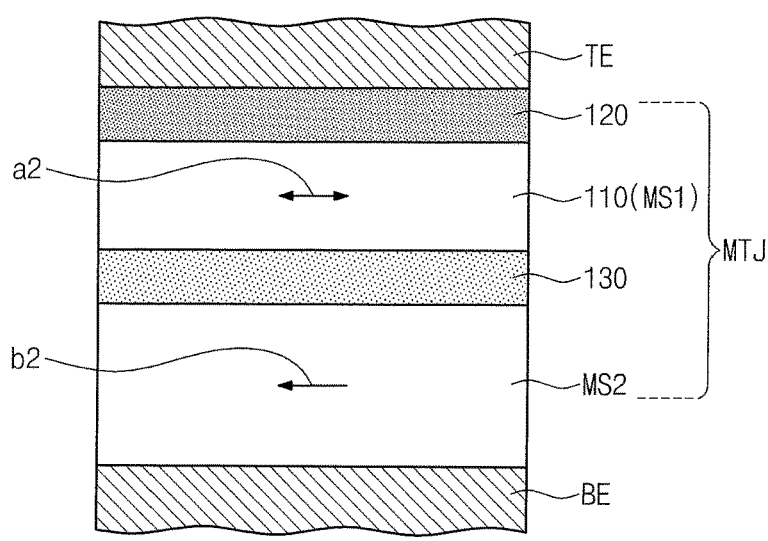
FIG. 5B is a sectional view illustrating another example of the magnetic tunnel junction of FIG. 4.

FIG. 5A is a sectional view illustrating an example of the magnetic tunnel junction of FIG. 4, and FIG. 5B is a sectional view illustrating another example of the magnetic tunnel junction of FIG. 4.

As shown in FIG. 5A, the magnetic pattern 110 of the first magnetic structure MS1 may be a free layer with a switchable magnetization direction a1. The second magnetic structure MS2 may include at least one fixed layer having a fixed magnetization direction b1. The magnetization directions a1 and b1 may be substantially perpendicular to the interface between the magnetic pattern 110 and the tunnel barrier pattern 130 (i.e., the first surface S1).

Although the magnetic pattern 110 exhibits the in-plane magnetization property intrinsically, the magnetization direction of the magnetic pattern 110 may be changed from an in-plane magnetization direction to a perpendicular magnetization direction by an external cause; that is, the magnetic pattern 110 may exhibit an extrinsic perpendicular magnetization property, if there is the external cause. In detail, the magnetic pattern 110 may be in contact with the tunnel barrier pattern 130, and such a contact between the magnetic pattern 110 and the tunnel barrier pattern 130 may induce magnetic anisotropy, allowing the magnetic pattern 110 to have the extrinsic perpendicular magnetization property. As an example, in the case where the tunnel barrier pattern 130 includes MgO and the magnetic pattern 110 includes CoFeB, the magnetic anisotropy may be caused by bonds between oxygen in the tunnel barrier pattern 130 and iron elements in the magnetic pattern 110. In addition, the magnetic pattern 110 may be in contact with the non-magnetic pattern 120, and such a contact between the magnetic pattern 110 and the non-magnetic pattern 120 may induce magnetic anisotropy, allowing the magnetic pattern 110 to have the extrinsic perpendicular magnetization property. For example, in the case where the non-magnetic pattern 120 includes TaBOx and the magnetic pattern 110 includes CoFeB, the magnetic anisotropy may be caused by bonds between oxygen in the non-magnetic pattern 120 and iron elements in the magnetic pattern 110. In some embodiments, since the magnetic pattern 110 is formed to be in contact with the non-magnetic pattern 120 containing oxygen, the perpendicular magnetization property of the magnetic pattern 110 can be improved.

The second magnetic structure MS2 may include at least one fixed layer having the perpendicular magnetization direction b1. The fixed layer may include at least one of perpendicular magnetic materials (e.g., CoFeTb, CoFeGd, and CoFeDy), perpendicular magnetic materials with $L1_0$ structure, CoPt-based materials with hexagonal-close-packed structure, and perpendicular magnetic structures. The $L1_0$ perpendicular magnetic material may include at least one of $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers.

In certain embodiments, as shown in FIG. 5B, the magnetic pattern 110 of the first magnetic structure MS1 may be a free layer with a switchable magnetization direction a2. The second magnetic structure MS2 may include at least one fixed layer having a fixed magnetization direction b2. The magnetization directions a2 and b2 may be substantially parallel to the interface between the magnetic pattern 110 and the tunnel barrier pattern 130 (i.e., the first surface S1). In this case, the magnetic pattern 110 may be formed to have a thickness, allowing it to have the in-plane magnetization direction a2. The second magnetic structure MS2 may include at least one fixed layer having the in-plane magnetization direction b2. The fixed layer may include a ferromagnetic material and an anti-ferromagnetic material for fixing a magnetization direction of the ferromagnetic material.

In general, the magnetic tunnel junction pattern MTJ may include a magnetic layer (e.g., a free layer) and an oxide layer on the magnetic layer. If a thermal treatment process is performed on the magnetic tunnel junction pattern MTJ, oxygen atoms in the oxide layer may be diffused into the magnetic layer. This may lead to deterioration in magnetic characteristics of the magnetic layer. Furthermore, in the case where a plurality of the magnetic tunnel junction patterns MTJ are provided, an amount of oxygen to be diffused into the magnetic layer of each of the magnetic tunnel junction patterns MTJ may vary between the magnetic tunnel junction patterns MTJ. In this case, an amount of a switching current required for switching the magnetization direction of the magnetic layer of each of the magnetic tunnel junction patterns MTJ may vary between the magnetic tunnel junction patterns MTJ. In other words, a variation in amount of a switching current between the magnetic tunnel junction patterns MTJ may increase.

According to some embodiments of the inventive concept, the non-magnetic pattern 120 may include the second non-metallic element that can be bonded with oxygen. The second non-metallic element may not be oxygen. In this case, even if a thermal treatment process is performed on the magnetic tunnel junction pattern MTJ, oxygen in the non-magnetic pattern 120 may be bonded with the second non-metallic element, thereby preventing or suppressing oxygen in the non-magnetic pattern 120 from being diffused into the magnetic pattern 110. This may make it possible to improve magnetic characteristics of the magnetic pattern 110 and to reduce a variation in amount of a switching current between the magnetic tunnel junction patterns MTJ.

Referring back to FIG. 4, an upper interlayered insulating layer 140 may be provided on the lower interlayered insulating layer 102 to cover the bottom electrode BE, the magnetic tunnel junction pattern MTJ, and the top electrode TE. An upper contact plug 150 may be provided to penetrate the upper interlayered insulating layer 140 and to be coupled to the top electrode TE. The upper interlayered insulating layer 140 may be formed of or include at least one of oxide, nitride, or oxynitride, and the upper contact plug 150 may be formed of or include at least one of metals (e.g., titanium, tantalum, copper, aluminum, or tungsten) or conductive metal nitrides (e.g., titanium nitride or tantalum nitride). An interconnection line 160 may be provided on the upper interlayered insulating layer 140. The interconnection line 160 may be coupled to the upper contact plug 150. The interconnection line 160 may be formed of or include at least one of metals (e.g., titanium, tantalum, copper, aluminum, or tungsten) or conductive metal nitrides (e.g., titanium nitride or tantalum nitride). In some embodiments, the interconnection line 160 may serve as a bit line.

Figure 6:
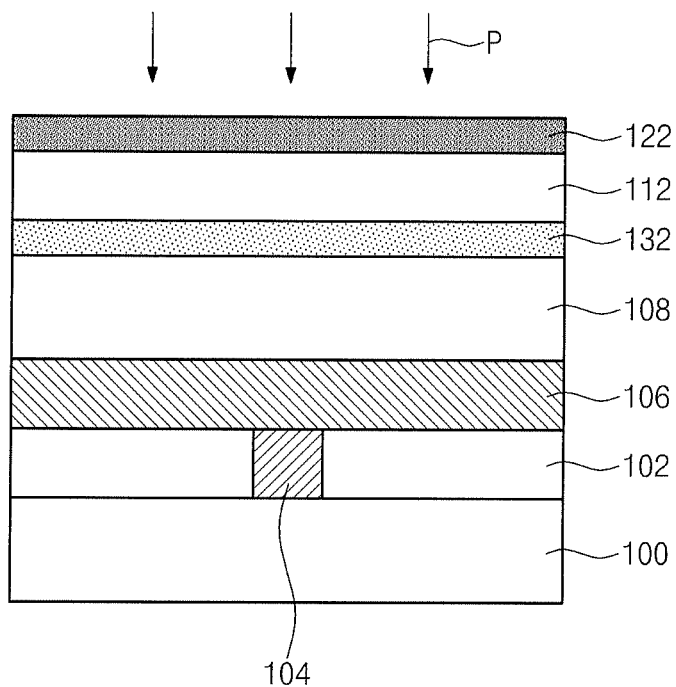
FIGS. 6 to 8 are sectional views illustrating a method of fabricating a magnetic memory device, according to some embodiments of the inventive concept.
Figure 7:
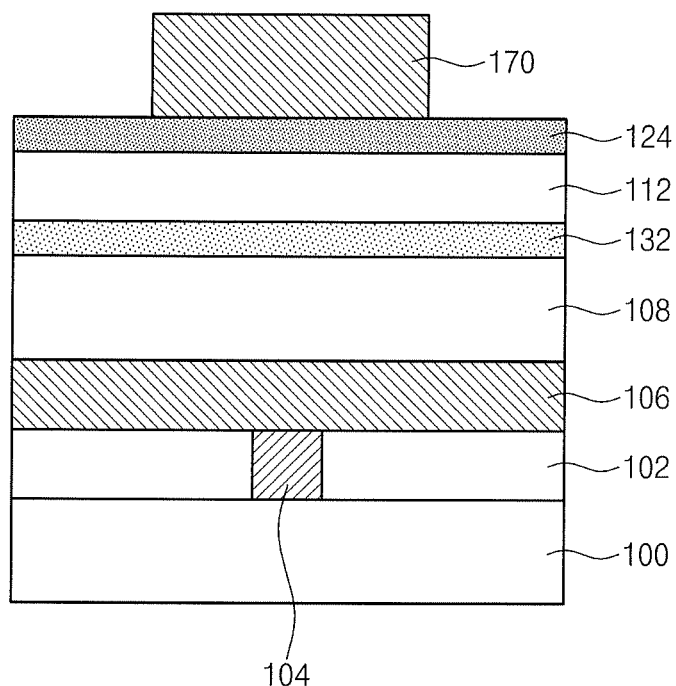
Figure 8:
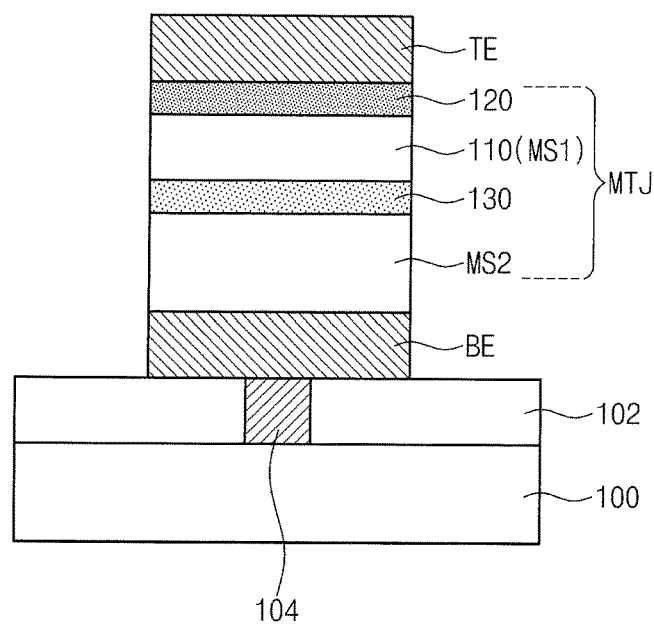

FIGS. 6 to 8 are sectional views illustrating a method of fabricating a magnetic memory device, according to some embodiments of the inventive concept.

Referring to FIG. 6, a lower interlayered insulating layer 102 may be formed on a substrate 100. The substrate 100 may include a semiconductor substrate. For example, the substrate 100 may include a silicon substrate, a germanium substrate, a silicon-germanium substrate, and so forth. In some embodiments, selection elements (not shown) may be formed on the substrate 100, and the lower interlayered insulating layer 102 may be formed to cover the selection elements. The selection elements may be field effect transistors. Alternatively, the selection elements may be diodes. The lower interlayered insulating layer 102 may be formed to have a single- or multi-layered structure including at least one of oxide, nitride, or oxynitride. A lower contact plug 104 may be formed in the lower interlayered insulating layer 102. The lower contact plug 104 may be formed to penetrate the lower interlayered insulating layer 102 and may be electrically coupled to a terminal of a corresponding one of the selection elements. The lower contact plug 104 may include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

A bottom electrode layer 106 may be formed on the lower interlayered insulating layer 102. The bottom electrode layer 106 may be formed of or include at least one of conductive metal nitrides (e.g., titanium nitride and tantalum nitride). The bottom electrode layer 106 may include a material (e.g., ruthenium (Ru)) contributing to crystal growth of magnetic layers. The bottom electrode layer 106 may be formed by a sputtering process, a chemical vapor deposition process, or an atomic layer deposition process. A first magnetic layer 112, a tunnel barrier layer 132, and a second magnetic layer 108 may be stacked on the bottom electrode layer 106. The second magnetic layer 108 may be formed between the bottom electrode layer 106 and the tunnel barrier layer 132, and the first magnetic layer 112 may be formed to be spaced apart from the second magnetic layer 108 with the tunnel barrier layer 132 interposed therebetween.

The second magnetic layer 108 may include at least one fixed layer having a fixed magnetization direction. A magnetization direction of the fixed layer may be substantially perpendicular to an interface between the tunnel barrier layer 132 and the first magnetic layer 112. In this case, the fixed layer may include at least one of perpendicular magnetic materials (e.g., CoFeTb, CoFeGd, and CoFeDy), perpendicular magnetic materials with L10 structure, CoPt-based materials with hexagonal-close-packed structure, and perpendicular magnetic structures. The $L1_0$ perpendicular magnetic material may include at least one of $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers. In certain embodiments, a magnetization direction of the fixed layer may be substantially parallel to the interface between the tunnel barrier layer 132 and the first magnetic layer 112. In this case, the fixed layer may include a ferromagnetic material. The fixed layer may further include an anti-ferromagnetic material that is provided to fix a magnetization direction of the ferromagnetic material in the fixed layer.

The tunnel barrier layer 132 may include at least one of magnesium oxide, titanium oxide, aluminum oxide, magnesium-zinc oxide, or magnesium-boron oxide.

The first magnetic layer 112 may be a free layer, whose magnetization direction can be changed to be parallel or anti-parallel to the fixed magnetization direction of the fixed layer. The first magnetic layer 112 may include a magnetic material exhibiting the intrinsic in-plane magnetization property. The intrinsic in-plane magnetization property may be realized by using a single- or multi-layered structure, in which at least one of cobalt (Co), iron (Fe), and alloys thereof is contained. In some embodiments, the first magnetic layer 112 may include cobalt (Co), iron (Fe), and a first non-metallic element. The first non-metallic element may be, for example, boron (B). The first magnetic layer 112 may be, for example, a single-layered structure of CoFeB. As an example, the first magnetic layer 112 may be formed to have a magnetization direction that is substantially perpendicular to the interface between the tunnel barrier layer 132 and the first magnetic layer 112. Although the first magnetic layer 112 exhibits the in-plane magnetization property intrinsically, the magnetization direction of the first magnetic layer 112 may be changed from an in-plane magnetization direction to a perpendicular magnetization direction by an external cause, as described previously with reference to FIG. 5A; that is, the first magnetic layer 112 may exhibit an extrinsic perpendicular magnetization property, if there is the external cause. In certain embodiments, the first magnetic layer 112 may be formed to have a magnetization direction that is substantially parallel to the interface between the tunnel barrier layer 132 and the first magnetic layer 112, as described with reference to FIG. 5B.

Each of the first magnetic layer 112, the tunnel barrier layer 132, and the second magnetic layer 108 may be formed by a sputtering process, a physical vapor deposition or chemical vapor deposition process.

A metal layer 122 may be formed on the first magnetic layer 112. The metal layer 122 may include a non-magnetic metallic element and a second non-metallic element. The non-magnetic metallic element may be at least one of, for example, Ta, Ti, Mg, Hf, Zr, W, or Mo. The second non-metallic element may be an element that can be bonded with oxygen and differs from oxygen. The second non-metallic element may be the same as the first non-metallic element. The second non-metallic element may be, for example, boron (B). The metal layer 122 may be a boron-doped metal layer (e.g., a boron-doped tantalum layer (TaB)). In the case where the first magnetic layer 112 and the metal layer 122 include boron (B), a boron concentration in the first magnetic layer 112 may be lower than that in the metal layer 122. Here, the boron concentration in the first magnetic layer 112 may be defined as a ratio (in percentage) of the number of boron atoms to the total number of atoms in the first magnetic layer 112, whereas the boron concentration in the metal layer 122 may be defined as a ratio (in percentage) of the number of boron atoms to the total number of atoms in the metal layer 122. For example, the boron concentration in the metal layer 122 may range from about 2 at % to about 50 at %. The metal layer 122 may be formed by, for example, a sputtering process. Thereafter, an oxidation process P may be performed on the metal layer 122. As an example, the oxidation process P may be performed using a natural oxidation method.

Referring to FIG. 7, as a result of the oxidation process P, the metal layer 122 may be oxidized to form a metal oxide layer 124 on the first magnetic layer 112. The metal oxide layer 124 may exhibit a non-magnetic property. The metal oxide layer 124 may include the non-magnetic metallic element, the second non-metallic element, and oxygen. The second non-metallic element may be, for example, boron. The metal oxide layer 124 may be boron-containing tantalum oxide (e.g., TaBOx). In some embodiments, at least a portion of the metal oxide layer 124 may be amorphous.

In the case where the first magnetic layer 112 and the metal oxide layer 124 include boron, a boron concentration in the first magnetic layer 112 may be lower than that in the metal oxide layer 124. Here, the boron concentration in the first magnetic layer 112 may be defined as a ratio (in percentage) of the number of boron atoms to the total number of atoms in the first magnetic layer 112, whereas the boron concentration in the metal oxide layer 124 may be defined as a ratio (in percentage) of the number of boron atoms to the total number of atoms, except for oxygen, in the metal oxide layer 124. An oxygen concentration in the metal oxide layer 124 may be lower than that in the tunnel barrier layer 132. Here, the oxygen concentration in the metal oxide layer 124 may be defined as a ratio (in percentage) of the number of oxygen atoms to the total number of atoms in the metal oxide layer 124, and the oxygen concentration in the tunnel barrier layer 132 may be defined as a ratio (in percentage) of the number of oxygen atoms to the total number of atoms in the tunnel barrier layer 132.

In the case where the metal layer 122 does not contain the second non-metallic element, oxygen, which are supplied into the metal layer 122 by the oxidation process P may be diffused into the first magnetic layer 112. This may lead to deterioration in magnetic characteristics of the first magnetic layer 112. Also, in the case where a patterning process is performed to divide the first magnetic layer 112 into a plurality of magnetic patterns, there may be a difference in amount of oxygen diffused into the magnetic patterns. In this case, there may be a difference in amount of a switching current required for switching the magnetization directions of the magnetic patterns. In other words, a variation in amount of the switching current may increase.

According to some embodiments of the inventive concept, the metal layer 122 may include the second non-metallic element (e.g., boron). In this case, oxygen, which is supplied into the metal layer 122 by the oxidation process P, may be bonded with the second non-metallic element. This may make it possible to prevent or suppress oxygen from being diffused into the first magnetic layer 112 during the oxidation process P. Furthermore, in the case where oxygen in the metal oxide layer 124 are bonded with the second non-metallic element, it is possible to prevent or suppress oxygen in the metal oxide layer 124 from being diffused into in the first magnetic layer 112 during a subsequent thermal treatment process. As a result, it is possible to improve magnetic characteristics of the first magnetic layer 112 and to reduce a variation in amount of the switching current between the magnetic patterns, which are formed by patterning the first magnetic layer 112.

A conductive mask pattern 170 may be formed on the metal oxide layer 124. The conductive mask pattern 170 may be formed of or include at least one of tungsten, titanium, tantalum, aluminum, or metal nitrides (e.g., titanium nitride and tantalum nitride). The conductive mask pattern 170 may be used to define a position and a shape of a magnetic tunnel junction pattern to be described below.

Referring to FIG. 8, the metal oxide layer 124, the first magnetic layer 112, the tunnel barrier layer 132, the second magnetic layer 108, and the bottom electrode layer 106 may be sequentially etched using the conductive mask pattern 170 as an etch mask. The etching process may be performed using, for example, an ion beam etching process. As a result of the etching process, a non-magnetic pattern 120, a magnetic pattern 110, a tunnel barrier pattern 130, a second magnetic structure MS2, and a bottom electrode BE may be formed from the metal oxide layer 124, the first magnetic layer 112, the tunnel barrier layer 132, the second magnetic layer 108, and the bottom electrode layer 106, respectively. The magnetic pattern 110 may constitute a first magnetic structure MS1. The first and second magnetic structures MS1 and MS2, the tunnel barrier pattern 130 therebetween, and the non-magnetic pattern 120 may constitute a magnetic tunnel junction pattern MTJ. The bottom electrode BE may be electrically connected to the lower contact plug 104 formed in the lower interlayered insulating layer 102, and the conductive mask pattern 170 may serve as the top electrode TE. The magnetic tunnel junction pattern MTJ may be formed between the bottom electrode BE and the top electrode TE.

Referring back to FIG. 4, the upper interlayered insulating layer 140 may be formed on the lower interlayered insulating layer 102 to cover the bottom electrode BE, the magnetic tunnel junction pattern MTJ, and the top electrode TE. An upper contact plug 150 may be formed to penetrate the upper interlayered insulating layer 140 and may be coupled to the top electrode TE. The upper interlayered insulating layer 140 may be formed of or include at least one of oxide, nitride, or oxynitride, and the upper contact plug 150 may be formed of or include at least one of metals (e.g., titanium, tantalum, copper, aluminum, or tungsten) or conductive metal nitrides (e.g., titanium nitride or tantalum nitride). An interconnection line 160 may be formed on the upper interlayered insulating layer 140. The interconnection line 160 may be coupled to the upper contact plug 150. The interconnection line 160 may be formed of or include at least one of metals (e.g., titanium, tantalum, copper, aluminum, or tungsten) or conductive metal nitrides (e.g., titanium nitride or tantalum nitride). In some embodiments, the interconnection line 160 may serve as a bit line.

Figure 9:
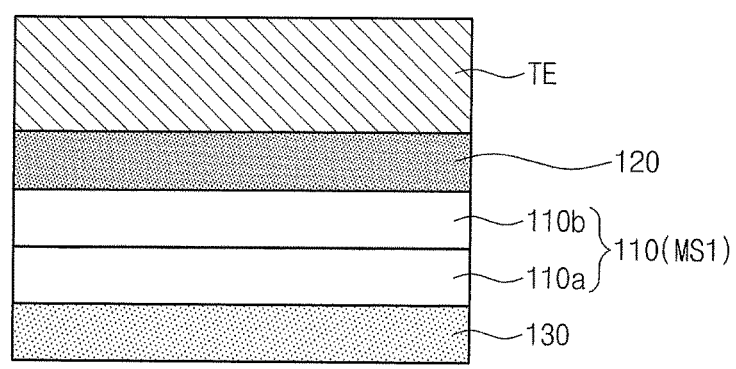
FIG. 9 is a sectional view illustrating a modified example of the first magnetic structure of FIG. 4.

FIG. 9 is a sectional view illustrating a modified example of the first magnetic structure of FIG. 4.

Referring to FIG. 9, the first magnetic structure MS1 may include the magnetic pattern 110. The magnetic pattern 110 may be provided between the tunnel barrier pattern 130 and the non-magnetic pattern 120, and the non-magnetic pattern 120 may be provided between the magnetic pattern 110 and the top electrode TE. In the present embodiment, the magnetic pattern 110 may include a lower magnetic pattern 110a and an upper magnetic pattern 110b. The lower magnetic pattern 110a may be in contact with the tunnel barrier pattern 130, and the upper magnetic pattern 110b may be spaced apart from the tunnel barrier pattern 130 with the lower magnetic pattern 110a interposed therebetween. The upper magnetic pattern 110b may be in contact with the non-magnetic pattern 120, and the lower magnetic pattern 110a may be spaced apart from the non-magnetic pattern 120 with the upper magnetic pattern 110b interposed therebetween. The lower magnetic pattern 110a and the upper magnetic pattern 110b may be in contact with each other.

Each or both of the lower magnetic pattern 110a and the upper magnetic pattern 110b may include a magnetic material exhibiting the intrinsic in-plane magnetization property. The intrinsic in-plane magnetization property may be realized by using a single- or multi-layered structure, in which at least one of cobalt (Co), iron (Fe), and alloys thereof is contained. In some embodiments, the lower magnetic pattern 110a may contain cobalt (Co), iron (Fe), and the first non-metallic element. The first non-metallic element may be, for example, boron (B). The upper magnetic pattern 110b may include cobalt (Co) and iron (Fe). In some embodiments, the upper magnetic pattern 110b may not contain the first non-metallic element. As an example, the lower magnetic pattern 110a may include CoFeB, whereas the upper magnetic pattern 110b may include CoFe. In other words, the magnetic pattern 110 may be a multi-layered structure of CoFeB/CoFe. In the case where the lower magnetic pattern 110a includes boron (B), a boron concentration in the upper magnetic pattern 110b may be lower than that in the lower magnetic pattern 110a. Here, the boron concentration in the upper magnetic pattern 110b may be defined as a ratio (in percentage) of the number of boron atoms to the total number of atoms in the upper magnetic pattern 110b, whereas the boron concentration in the lower magnetic pattern 110a may be defined as a ratio (in percentage) of the number of boron atoms to the total number of atoms in the lower magnetic pattern 110a. Furthermore, in the case where the non-magnetic pattern 120 includes boron (B), the boron concentration in the upper magnetic pattern 110b may be lower than that in the non-magnetic pattern 120. Here, the boron concentration in the non-magnetic pattern 120 may be defined as a ratio (in percentage) of the number of boron atoms to the total number of atoms, except for oxygen, in the non-magnetic pattern 120.

In some embodiments, as described with reference to FIG. 5A, the magnetic pattern 110 of the first magnetic structure MS1 may be a free layer with a switchable magnetization direction a1, and the magnetization direction a1 may be substantially perpendicular to the interface between the magnetic pattern 110 and the tunnel barrier pattern 130 (i.e., the interface between the lower magnetic pattern 110a and the tunnel barrier pattern 130). In this case, each of the lower and upper magnetic patterns 110a and 110b may have a magnetization direction that is perpendicular to the interface between the lower magnetic pattern 110a and the tunnel barrier pattern 130. Although the lower and upper magnetic patterns 110a and 110b exhibits the in-plane magnetization property intrinsically, the magnetization directions of the lower and upper magnetic patterns 110a and 110b may be changed from an in-plane magnetization direction to a perpendicular magnetization direction by an external cause; that is, the lower and upper magnetic patterns 110a and 110b may exhibit an extrinsic perpendicular magnetization property, if there is the external cause. In detail, the lower magnetic pattern 110a may be in contact with the tunnel barrier pattern 130, and such a contact between the lower magnetic pattern 110a and the tunnel barrier pattern 130 may induce magnetic anisotropy, allowing the lower magnetic pattern 110a to have the extrinsic perpendicular magnetization property. The upper magnetic pattern 110b may be in contact with the non-magnetic pattern 120, and such a contact between the upper magnetic pattern 110b and the non-magnetic pattern 120 may induce magnetic anisotropy, allowing the upper magnetic pattern 110b to have the extrinsic perpendicular magnetization property.

In certain embodiments, as described with reference to FIG. 5B, the magnetic pattern 110 of the first magnetic structure MS1 may be a free layer with a switchable magnetization direction a2, and the magnetization direction a2 may be substantially parallel to the interface between the magnetic pattern 110 and the tunnel barrier pattern 130 (i.e., the interface between the lower magnetic pattern 110a and the tunnel barrier pattern 130). In this case, each of the lower and upper magnetic patterns 110a and 110b may have a magnetization direction that is parallel to the interface between the lower magnetic pattern 110a and the tunnel barrier pattern 130. Each of the lower and upper magnetic patterns 110a and 110b may be formed to have a thickness, allowing it to have the in-plane magnetization direction.

Figure 10:
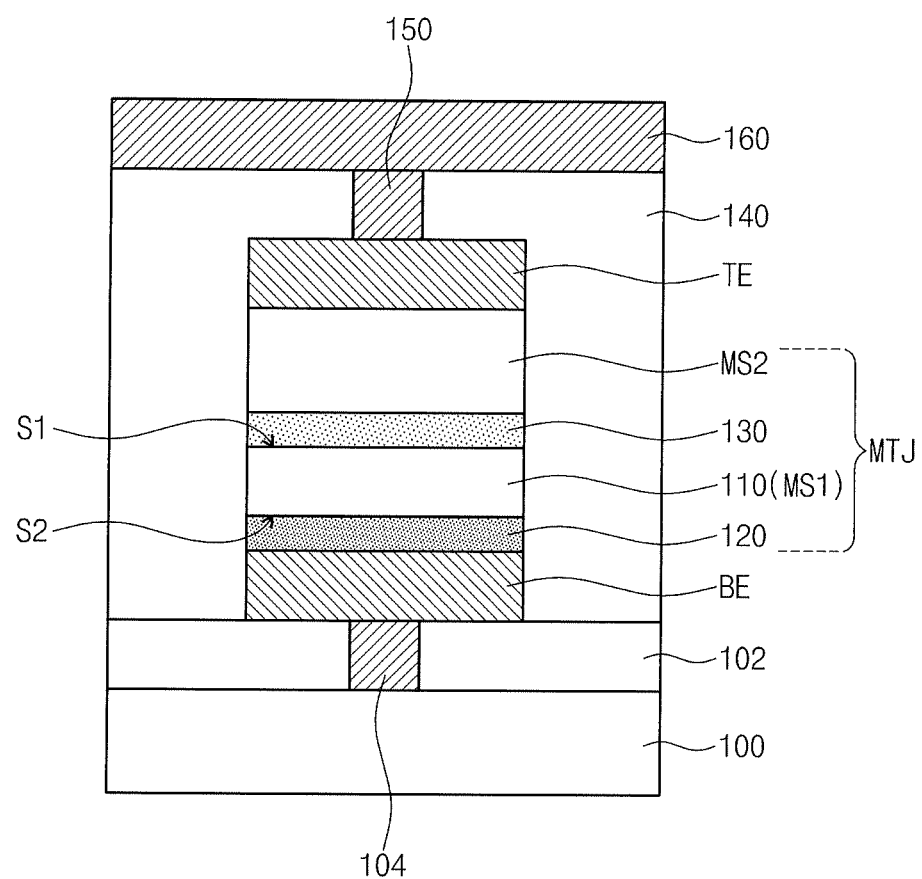
FIG. 10 is a sectional view illustrating a magnetic memory device according to some embodiments of the inventive concept.

FIG. 10 is a sectional view illustrating a magnetic memory device according to some embodiments of the inventive concept. In the following description, an element previously described with reference to FIG. 4 may be identified by a similar or identical reference number without repeating an overlapping description thereof, for the sake of brevity.

Referring to FIG. 10, a lower interlayered insulating layer 102 may be provided on a substrate 100. Selection elements (not shown) may be provided on the substrate 100, and the lower interlayered insulating layer 102 may be provided to cover the selection elements. The selection elements may be field effect transistors or diodes. A lower contact plug 104 may be provided in the lower interlayered insulating layer 102. The lower contact plug 104 may be provided to penetrate the lower interlayered insulating layer 102 and may be electrically coupled to a terminal of a corresponding one of the selection elements.

A bottom electrode BE, a magnetic tunnel junction pattern MTJ, and a top electrode TE may be sequentially stacked on the lower interlayered insulating layer 102. The bottom electrode BE may be electrically coupled to a top surface of the lower contact plug 104. The magnetic tunnel junction pattern MTJ may include a first magnetic structure MS1, a second magnetic structure MS2, and a tunnel barrier pattern 130 therebetween. The first magnetic structure MS1 may be provided between the bottom electrode BE and the tunnel barrier pattern 130, and the second magnetic structure MS2 may be provided between the top electrode TE and the tunnel barrier pattern 130. The magnetic tunnel junction pattern MTJ may include a non-magnetic pattern 120 that is spaced apart from the tunnel barrier pattern 130 with the first magnetic structure MS1 interposed therebetween. The non-magnetic pattern 120 may be interposed between the first magnetic structure MS1 and the bottom electrode BE. The first magnetic structure MS1 may include a magnetic pattern 110. The magnetic pattern 110 may be provided between the tunnel barrier pattern 130 and the non-magnetic pattern 120, and the non-magnetic pattern 120 may be provided between the magnetic pattern 110 and the bottom electrode BE.

The magnetic pattern 110 may include a magnetic material exhibiting the intrinsic in-plane magnetization property. In some embodiments, the magnetic pattern 110 may include cobalt (Co), iron (Fe), and a first non-metallic element. The first non-metallic element may be, for example, boron (B). For example, the magnetic pattern 110 may be a single layered structure of CoFeB.

The non-magnetic pattern 120 may be an oxide layer. The non-magnetic pattern 120 may be formed of or include metal oxide. The non-magnetic pattern 120 may include a non-magnetic metallic element, oxygen, and a second non-metallic element that can be bonded with the oxygen. The second non-metallic element may not be oxygen. The non-magnetic metallic element may be at least one of, for example, Ta, Ti, Mg, Hf, Zr, W, or Mo. The second non-metallic element may be the same as the first non-metallic element. The second non-metallic element may be, for example, boron (B). For example, the non-magnetic pattern 120 may include a boron-containing metal oxide (e.g., boron-containing tantalum oxide (TaBOx)). In the case where the magnetic pattern 110 and the non-magnetic pattern 120 include boron, a boron concentration in the magnetic pattern 110 may be lower than that in the non-magnetic pattern 120. Here, the boron concentration in the magnetic pattern 110 may be defined as a ratio (in percentage) of the number of boron atoms to the total number of atoms in the magnetic pattern 110, whereas the boron concentration in the non-magnetic pattern 120 may be defined as a ratio (in percentage) of the number of boron atoms to the total number of atoms, except for oxygen, in the non-magnetic pattern 120. The boron concentration in the non-magnetic pattern 120 may range from about 2 at % to about 50 at %. In some embodiments, at least a portion of the non-magnetic pattern 120 may be amorphous.

The magnetic pattern 110 may include a first surface S1 in contact with the tunnel barrier pattern 130 and a second surface S2 opposite to the first surface S1. The non-magnetic pattern 120 may be in contact with the second surface S2 of the magnetic pattern 110.

Figure 11A:
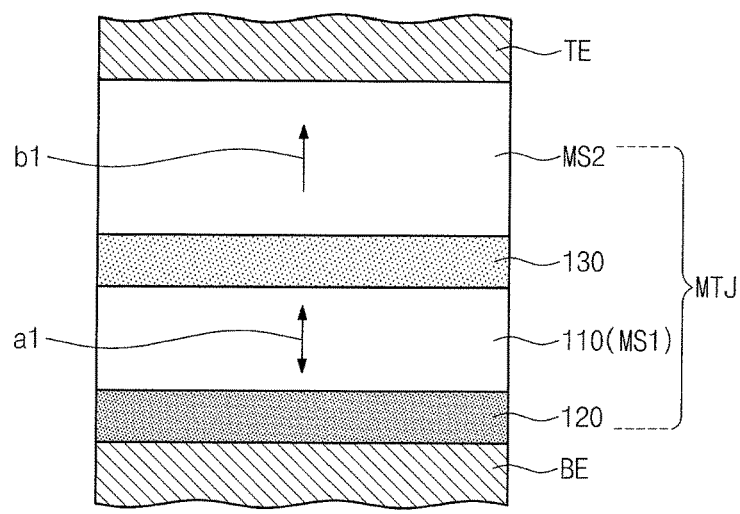
FIG. 11A is a sectional view illustrating an example of the magnetic tunnel junction of FIG. 10.
Figure 11B:
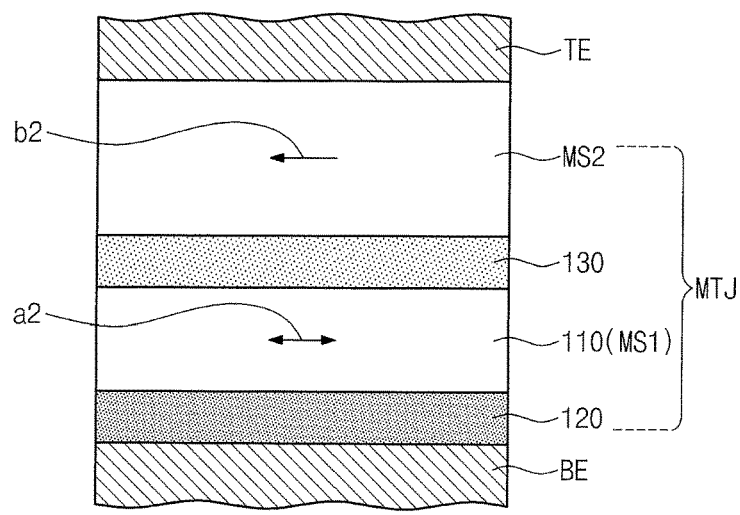
FIG. 11B is a sectional view illustrating another example of the magnetic tunnel junction of FIG. 10.

FIG. 11A is a sectional view illustrating an example of the magnetic tunnel junction of FIG. 10, and FIG. 11B is a sectional view illustrating another example of the magnetic tunnel junction of FIG. 10.

In some embodiments, as shown in FIG. 11A, the magnetic pattern 110 of the first magnetic structure MS1 may be a free layer with a switchable magnetization direction a1. The second magnetic structure MS2 may include at least one fixed layer having a fixed magnetization direction b1. The magnetization directions a1 and b1 may be substantially perpendicular to the interface between the magnetic pattern 110 and the tunnel barrier pattern 130 (i.e., the first surface S1). Although the magnetic pattern 110 exhibits the in-plane magnetization property intrinsically, the magnetization direction of the magnetic pattern 110 may be changed from an in-plane magnetization direction to a perpendicular magnetization direction by an external cause; that is, the magnetic pattern 110 may exhibit an extrinsic perpendicular magnetization property, if there is the external cause. The extrinsic perpendicular magnetization property may be the same as that described with reference to FIG. 5A. In some embodiments, since the magnetic pattern 110 is formed to be in contact with the non-magnetic pattern 120 containing oxygen, the perpendicular magnetization property of the magnetic pattern 110 can be improved. The second magnetic structure MS2 may include at least one fixed layer having the perpendicular magnetization direction b1. The fixed layer may include the perpendicular magnetic material and/or the perpendicular magnetic structure described with reference to FIG. 5A.

In certain embodiments, as shown in FIG. 11B, the magnetic pattern 110 of the first magnetic structure MS1 may be a free layer with a switchable magnetization direction a2. The second magnetic structure MS2 may include at least one fixed layer having a fixed magnetization direction b2. The magnetization directions a2 and b2 may be substantially parallel to the interface between the magnetic pattern 110 and the tunnel barrier pattern 130 (i.e., the first surface S1). In this case, the magnetic pattern 110 may be formed to have a thickness, allowing it to have the in-plane magnetization direction a2. The second magnetic structure MS2 may include at least one fixed layer having the in-plane magnetization direction b2. The fixed layer may include a ferromagnetic material and an anti-ferromagnetic material for fixing a magnetization direction of the ferromagnetic material.

According to the present embodiment, the non-magnetic pattern 120 may include the second non-metallic element that can be bonded with oxygen. The second non-metallic element may not be oxygen. In this case, even if a thermal treatment process is performed on the magnetic tunnel junction pattern MTJ, oxygen in the non-magnetic pattern 120 may be bonded with the second non-metallic element, thereby preventing or suppressing oxygen in the non-magnetic pattern 120 from being diffused into the magnetic pattern 110. This may make it possible to improve magnetic characteristics of the magnetic pattern 110 and to reduce a variation in amount of a switching current between the magnetic tunnel junction patterns MTJ.

Referring back to FIG. 10, the upper interlayered insulating layer 140 may be provided on the lower interlayered insulating layer 102 to cover the bottom electrode BE, the magnetic tunnel junction pattern MTJ, and the top electrode TE. An upper contact plug 150 may be provided to penetrate the upper interlayered insulating layer 140 and to be coupled to the top electrode TE. An interconnection line 160 may be disposed on the upper interlayered insulating layer 140, and the interconnection line 160 may be coupled to the upper contact plug 150. In some embodiments, the interconnection line 160 may serve as a bit line.

Figure 12:
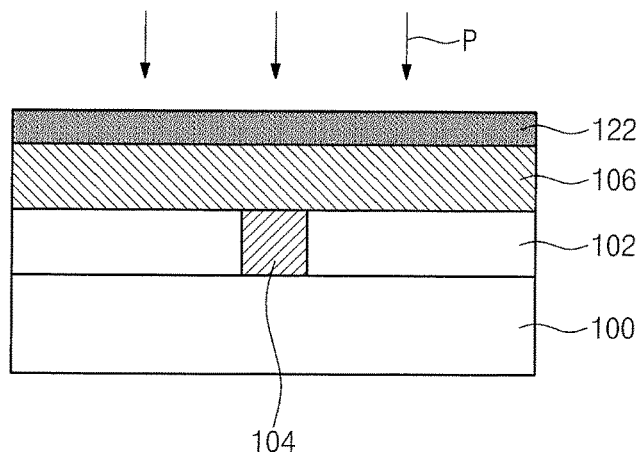
FIGS. 12 to 14 are sectional views illustrating a method of fabricating a magnetic memory device, according to some embodiments of the inventive concept.
Figure 13:
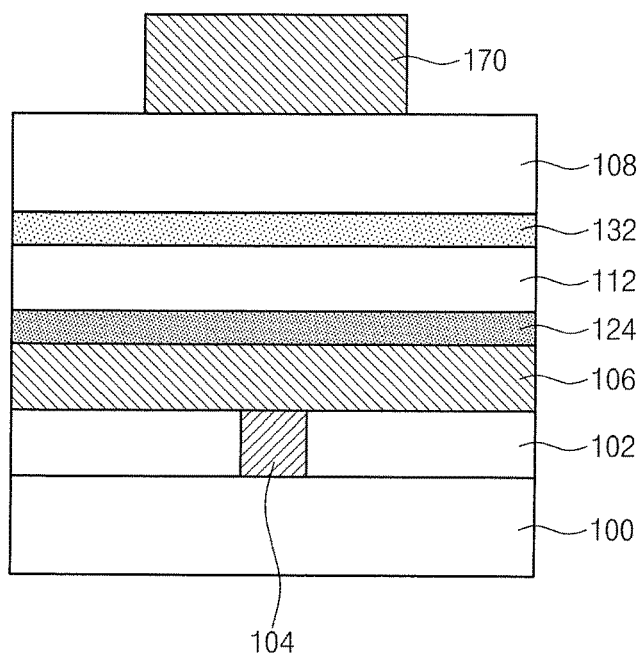
Figure 14:
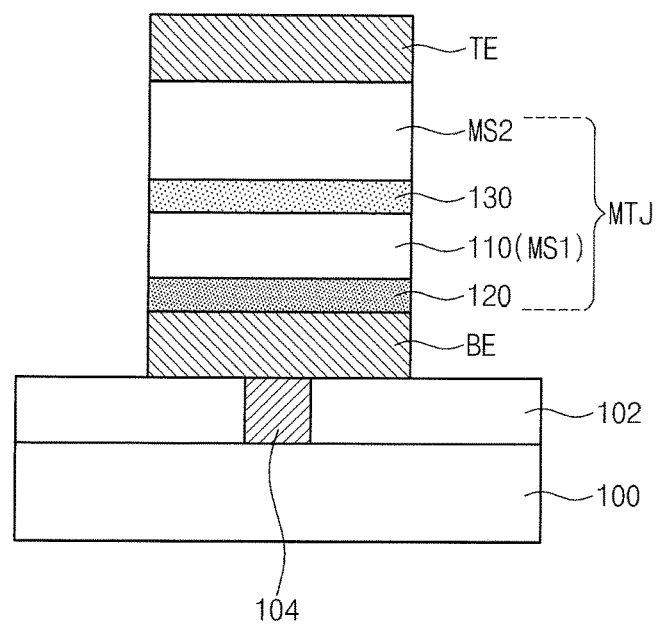

FIGS. 12 to 14 are sectional views illustrating a method of fabricating a magnetic memory device, according to some embodiments of the inventive concept. In the following description, an element or a fabrication step previously described with reference to FIGS. 6 to 8 may be identified by a similar or identical reference number without repeating an overlapping description thereof, for the sake of brevity.

Referring to FIG. 12, a lower interlayered insulating layer 102 may be formed on a substrate 100. In some embodiments, selection elements (not shown) may be formed on the substrate 100, and the lower interlayered insulating layer 102 may be formed to cover the selection elements. A lower contact plug 104 may be formed in the lower interlayered insulating layer 102. The lower contact plug 104 may be formed to penetrate the lower interlayered insulating layer 102 and may be electrically coupled to a terminal of a corresponding one of the selection elements.

A bottom electrode layer 106 may be formed on the lower interlayered insulating layer 102, and a metal layer 122 may be formed on the bottom electrode layer 106. The metal layer 122 may include a non-magnetic metallic element and a non-metallic element. The non-magnetic metallic element may be at least one of, for example, Ta, Ti, Mg, Hf, Zr, W, or Mo. The non-metallic element may be an element that can be bonded with oxygen and is not oxygen. As an example, the non-metallic element may be, for example, boron (B). The metal layer 122 may be a boron-doped metal layer (e.g., a boron-doped tantalum layer (TaB)). For example, the boron concentration in the metal layer 122 may range from about 2 at % to about 50 at %. Thereafter, an oxidation process P may be performed on the metal layer 122. As an example, the oxidation process P may be performed using a natural oxidation method.

Referring to FIG. 13, as a result of the oxidation process P, the metal layer 122 may be oxidized to form a metal oxide layer 124 on the bottom electrode layer 106. The metal oxide layer 124 may include the non-magnetic metallic element, the non-metallic element, and oxygen. The metal oxide layer 124 may be boron-containing tantalum oxide (e.g., TaBOx). In some embodiments, at least a portion of the metal oxide layer 124 may be amorphous.

A first magnetic layer 112, a tunnel barrier layer 132, and a second magnetic layer 108 may be sequentially stacked on the metal oxide layer 124. The first magnetic layer 112 may be formed between the metal oxide layer 124 and the tunnel barrier layer 132, and the second magnetic layer 108 may be formed to be spaced apart from the first magnetic layer 112 with the tunnel barrier layer 132 interposed therebetween.

The first magnetic layer 112 may be a free layer, whose magnetization direction can be changed to be parallel or anti-parallel to a fixed magnetization direction of a fixed layer to be described below. The first magnetic layer 112 may include a magnetic material exhibiting the intrinsic in-plane magnetization property. In some embodiments, the first magnetic layer 112 may include cobalt (Co), iron (Fe), and a non-metallic element. Hereinafter, the non-metallic element in the first magnetic layer 112 will be referred to as a first non-metallic element, and the non-metallic element in the metal oxide layer 124 will be referred to as a second non-metallic element. The first non-metallic element in the first magnetic layer 112 may be the same as the second non-metallic element in the metal oxide layer 124. The first non-metallic element may be, for example, boron (B). The first magnetic layer 112 may be a single-layered structure of CoFeB.

In some embodiments, the first magnetic layer 112 may be formed to have a magnetization direction that is substantially perpendicular to the interface between the tunnel barrier layer 132 and the first magnetic layer 112. Although the first magnetic layer 112 exhibits the in-plane magnetization property intrinsically, the magnetization direction of the first magnetic layer 112 may be changed from an in-plane magnetization direction to a perpendicular magnetization direction by an external cause, as described with reference to FIG. 11A; that is, the first magnetic layer 112 may exhibit an extrinsic perpendicular magnetization property, if there is the external cause. In certain embodiments, the first magnetic layer 112 may be formed to have a magnetization direction that is substantially parallel to the interface between the tunnel barrier layer 132 and the first magnetic layer 112, as described with reference to FIG. 11B.

In the case where the first magnetic layer 112 and the metal oxide layer 124 include boron, a boron concentration in the first magnetic layer 112 may be lower than that in the metal oxide layer 124. Here, the boron concentration in the first magnetic layer 112 may be defined as a ratio (in percentage) of the number of boron atoms to the total number of atoms in the first magnetic layer 112, whereas the boron concentration in the metal oxide layer 124 may be defined as a ratio (in percentage) of the number of boron atoms to the total number of atoms, except for oxygen, in the metal oxide layer 124. An oxygen concentration in the metal oxide layer 124 may be lower than that in the tunnel barrier layer 132. Here, the oxygen concentration in the metal oxide layer 124 may be defined as a ratio (in percentage) of the number of oxygen atoms to the total number of atoms in the metal oxide layer 124, and the oxygen concentration in the tunnel barrier layer 132 may be defined as a ratio (in percentage) of the number of oxygen atoms to the total number of atoms in the tunnel barrier layer 132.

The second magnetic layer 108 may include at least one fixed layer having a fixed magnetization direction. A magnetization direction of the fixed layer may be substantially perpendicular to an interface between the tunnel barrier layer 132 and the first magnetic layer 112. In this case, the fixed layer may include a perpendicular magnetic material and/or a perpendicular magnetic structure, as described with reference to FIG. 6. In certain embodiments, a magnetization direction of the fixed layer may be substantially parallel to the interface between the tunnel barrier layer 132 and the first magnetic layer 112. In this case, the fixed layer may include a ferromagnetic material. The fixed layer may further include an anti-ferromagnetic material that is provided to fix a magnetization direction of the ferromagnetic material in the fixed layer.

A conductive mask pattern 170 may be formed on the second magnetic layer 108. The conductive mask pattern 170 may be used to define a position and a shape of a magnetic tunnel junction pattern to be described below.

Referring to FIG. 14, the second magnetic layer 108, the tunnel barrier layer 132, the first magnetic layer 112, the metal oxide layer 124, and the bottom electrode layer 106 may be sequentially etched using the conductive mask pattern 170 as an etch mask. The etching process may be performed using, for example, an ion beam etching process. As a result of the etching process, a second magnetic structure MS2, a tunnel barrier pattern 130, a magnetic pattern 110, a non-magnetic pattern 120, and a bottom electrode BE may be formed from the second magnetic layer 108, the tunnel barrier layer 132, the first magnetic layer 112, the metal oxide layer 124, and the bottom electrode layer 106, respectively. The magnetic pattern 110 may constitute a first magnetic structure MS1. The first and second magnetic structures MS1 and MS2, the tunnel barrier pattern 130 therebetween, and the non-magnetic pattern 120 may constitute a magnetic tunnel junction pattern MTJ. The bottom electrode BE may be electrically connected to the lower contact plug 104 formed in the lower interlayered insulating layer 102, and the conductive mask pattern 170 may serve as the top electrode TE. The magnetic tunnel junction pattern MTJ may be formed between the bottom electrode BE and the top electrode TE.

A subsequent process may be performed in substantially the same manner as that of the method described with reference to FIG. 4.

Figure 15:
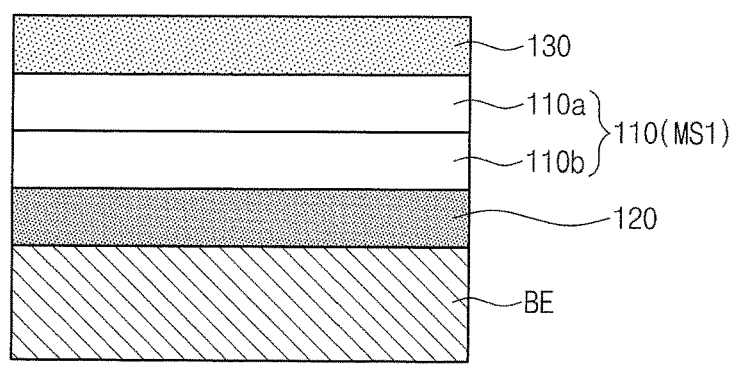
FIG. 15 is a sectional view illustrating a modified example of the first magnetic structure of FIG. 10.

FIG. 15 is a sectional view illustrating a modified example of the first magnetic structure of FIG. 10.

Referring to FIG. 15, the first magnetic structure MS1 may include the magnetic pattern 110. The magnetic pattern 110 may be provided between the tunnel barrier pattern 130 and the non-magnetic pattern 120, and the non-magnetic pattern 120 may be provided between the magnetic pattern 110 and the bottom electrode BE. In the present embodiment, the magnetic pattern 110 may include a lower magnetic pattern 110a and an upper magnetic pattern 110b. The lower magnetic pattern 110a may be in contact with the tunnel barrier pattern 130, and the upper magnetic pattern 110b may be spaced apart from the tunnel barrier pattern 130 with the lower magnetic pattern 110a interposed therebetween. The upper magnetic pattern 110b may be in contact with the non-magnetic pattern 120, and the lower magnetic pattern 110a may be spaced apart from the non-magnetic pattern 120 with the upper magnetic pattern 110b interposed therebetween. The lower magnetic pattern 110a and the upper magnetic pattern 110b may be in contact with each other.

Each or both of the lower magnetic pattern 110a and the upper magnetic pattern 110b may include a magnetic material exhibiting the intrinsic in-plane magnetization property. In some embodiments, the lower magnetic pattern 110a may contain cobalt (Co), iron (Fe), and the first non-metallic element. The first non-metallic element may be, for example, boron (B). The upper magnetic pattern 110b may include cobalt (Co) and iron (Fe). In some embodiments, the upper magnetic pattern 110b may not contain the first non-metallic element. As an example, the lower magnetic pattern 110a may include CoFeB, whereas the upper magnetic pattern 110b may include CoFe. In other words, the magnetic pattern 110 may be a multi-layered structure of CoFeB/CoFe. In the case where the lower magnetic pattern 110a includes boron (B), a boron concentration in the upper magnetic pattern 110b may be lower than that in the lower magnetic pattern 110a. Here, the boron concentration in the upper magnetic pattern 110b may be defined as a ratio (in percentage) of the number of boron atoms to the total number of atoms in the upper magnetic pattern 110b, whereas the boron concentration in the lower magnetic pattern 110a may be defined as a ratio (in percentage) of the number of boron atoms to the total number of atoms in the lower magnetic pattern 110a. Furthermore, in the case where the non-magnetic pattern 120 includes boron (B), the boron concentration in the upper magnetic pattern 110b may be lower than that in the non-magnetic pattern 120. Here, the boron concentration in the non-magnetic pattern 120 may be defined as a ratio (in percentage) of the number of boron atoms to the total number of atoms, except for oxygen, in the non-magnetic pattern 120.

In some embodiments, as described with reference to FIG. 11A, the magnetic pattern 110 of the first magnetic structure MS1 may be a free layer with a switchable magnetization direction a1, and the magnetization direction a1 may be substantially perpendicular to the interface between the magnetic pattern 110 and the tunnel barrier pattern 130 (i.e., the interface between the lower magnetic pattern 110a and the tunnel barrier pattern 130). In this case, each of the lower and upper magnetic patterns 110a and 110b may have a magnetization direction that is perpendicular to the interface between the lower magnetic pattern 110a and the tunnel barrier pattern 130. Although the lower and upper magnetic patterns 110a and 110b exhibits the in-plane magnetization property intrinsically, the magnetization directions of the lower and upper magnetic patterns 110a and 110b may be changed from an in-plane magnetization direction to a perpendicular magnetization direction by an external cause; that is, the lower and upper magnetic patterns 110a and 110b may exhibit an extrinsic perpendicular magnetization property, if there is the external cause. In detail, the lower magnetic pattern 110a may be in contact with the tunnel barrier pattern 130, and such a contact between the lower magnetic pattern 110a and the tunnel barrier pattern 130 may induce magnetic anisotropy, allowing the lower magnetic pattern 110a to have the extrinsic perpendicular magnetization property. The upper magnetic pattern 110b may be in contact with the non-magnetic pattern 120, and such a contact between the upper magnetic pattern 110b and the non-magnetic pattern 120 may induce magnetic anisotropy, allowing the upper magnetic pattern 110b to have the extrinsic perpendicular magnetization property.

In certain embodiments, as described with reference to FIG. 11B, the magnetic pattern 110 of the first magnetic structure MS1 may be a free layer with a switchable magnetization direction a2, the magnetization direction a2 may be substantially parallel to the interface between the magnetic pattern 110 and the tunnel barrier pattern 130 (i.e., the interface between the lower magnetic pattern 110a and the tunnel barrier pattern 130). In this case, each of the lower and upper magnetic patterns 110a and 110b may have a magnetization direction that is parallel to the interface between the lower magnetic pattern 110a and the tunnel barrier pattern 130. Each of the lower and upper magnetic patterns 110a and 110b may be formed to have a thickness, allowing it to have the in-plane magnetization direction.

According to some embodiments of the inventive concept, a magnetic tunnel junction may include a magnetic layer and a non-magnetic layer adjacent thereto, and the non-magnetic layer may contain a non-metallic element (e.g., boron) that can be bonded with oxygen. In this case, even when a thermal treatment process is performed on the magnetic tunnel junction, oxygen in the non-magnetic layer may be bonded with the non-metallic element, and thus, it is possible to prevent or suppress oxygen in the non-magnetic layer from being diffused into the magnetic layer. Accordingly, it is possible to improve magnetic characteristics of the magnetic layer and to reduce a variation in amount of a switching current between the magnetic tunnel junctions.

In addition, the non-magnetic layer may be interposed between the magnetic layer and a crystalline layer adjacent thereto. In the case where at least a portion of the non-magnetic layer is amorphous, it is possible to minimize that a crystal structure of the crystalline layer affects a crystal growth of the magnetic layer. As a result, it is possible to improve magnetic characteristics of the magnetic layer.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
    a first electrode;
    a first magnetic structure spaced apart from the first electrode, the first magnetic structure including a magnetic pattern therein; and
    an oxidized non-magnetic pattern between the first magnetic structure and the first electrode, the oxidized non-magnetic pattern including a non-metallic element having a standard free energy of oxide formation that is less than about that of a standard free energy of oxide formation of Fe.

2. The device of claim 1, wherein the non-metallic element comprises a Boron group element.

3. The device of claim 1, wherein the non-metallic element comprises Boron.

4. The device of claim 1, wherein the non-metallic element is configured to remain bonded to oxygen after an anneal of the device.

5. The device of claim 1 further comprising:
    a second magnetic structure spaced apart from the first magnetic structure; and
    a tunnel barrier pattern between the first and second magnetic structures.

6. The device of claim 1 wherein a concentration of the non-metallic element in the oxidized non-magnetic pattern is greater than a concentration of the non-metallic element in the magnetic pattern.

7. The device of claim 1 wherein the magnetic pattern comprises an upper magnetic pattern contacting the oxidized non-magnetic pattern, the first magnetic structure further comprising:
    a lower magnetic pattern on the upper magnetic pattern, the lower magnetic pattern having a concentration of the non-metallic element that is greater than a concentration of the non-metallic element in the upper magnetic pattern.

8. The device of claim 7 wherein the upper magnetic pattern comprises a CoFe layer that is free of B and the lower magnetic pattern comprises a CoFeB layer.

9. The device of claim 7 wherein the concentration of the non-metallic element in the upper magnetic pattern is substantially zero at an interface where the upper magnetic pattern contacts the oxidized non-magnetic pattern.

10. The device of claim 1 wherein the magnetic pattern contacts the oxidized non-magnetic pattern at an interface, wherein the magnetic pattern comprises a graded concentration of the non-metallic element that is greater remote from the interface than proximate to the interface.

11. The device of claim 10 wherein the magnetic pattern comprises CoFeB wherein the non-metallic element comprises B.

12. The device of claim 10 wherein a concentration of the non-metallic element proximate to the interface is zero.

13. The device of claim 1 wherein the magnetic pattern comprises a layer of B contacting the oxidized non-magnetic pattern.

14. The device of claim 13 wherein the oxidized non-magnetic pattern comprises TaBOx.

15. The device of claim 13 wherein a concentration of B in the magnetic pattern is greater than a concentration of B in the oxidized non-magnetic pattern.

16. The device of claim 1 wherein the magnetic pattern comprises a layer of CoFe that is free of B contacting the oxidized non-magnetic pattern.

17. A magnetic memory device, comprising:
    a first electrode;
    a first magnetic structure spaced apart from the first electrode, the first magnetic structure including a magnetic pattern therein; and
    an oxidized non-magnetic pattern between the first magnetic structure and the first electrode, the oxidized non-magnetic pattern including B.

18. The device of claim 17 wherein the magnetic pattern is free of B.

19. The device of claim 17 wherein the magnetic pattern comprises a lower magnetic pattern including B and an upper magnetic pattern contacting the oxidized non-magnetic pattern that is free of B.

20. The device of claim 19 wherein the upper magnetic pattern comprises CoFe and the lower magnetic pattern comprises CoFeB.

21. The device of claim 19 wherein the magnetic pattern contacts the oxidized non-magnetic pattern at an interface, wherein the magnetic pattern comprises a graded concentration of the B that is greater remote from the interface than proximate to the interface.

22. The device of claim 21 wherein a concentration of the B proximate to the interface is zero.

23. A magnetic memory device, comprising:
a first electrode;
a first magnetic structure, the first magnetic structure including a magnetic pattern comprising CoFeB;
a non-magnetic pattern between the first magnetic structure and the first electrode, the non-magnetic pattern comprising TaBOx;
a second magnetic structure spaced apart from the first magnetic structure; and
a tunnel barrier pattern between the first magnetic structure and the second magnetic structure.

24. The device of claim 23 wherein a concentration of B in the magnetic pattern is greater than a concentration of B in the non-magnetic pattern.

25. The device of claim 23 wherein the non-magnetic pattern contacts the magnetic pattern.

26. A magnetic memory device, comprising:
a first electrode;
a first magnetic structure, the first magnetic structure including a graded magnetic pattern comprising CoFeB;
a non-magnetic pattern between the first magnetic structure and the first electrode, the non-magnetic pattern comprising TaBOx;
a second magnetic structure spaced apart from the first magnetic structure; and
a tunnel barrier pattern between the first magnetic structure and the second magnetic structure.

27. The device of claim 26 wherein the graded magnetic pattern contacts the non-magnetic pattern at an interface, wherein the graded magnetic pattern comprises a graded concentration of B that is greater remote from the interface than proximate to the interface.

28. The device of claim 27 wherein the graded concentration of the B proximate to the interface is zero.

29. The device of claim 26 wherein the non-magnetic pattern contacts the magnetic pattern.

* * * * *